United States Patent
Fox et al.

(10) Patent No.: US 6,627,930 B1
(45) Date of Patent: Sep. 30, 2003

(54) FERROELECTRIC THIN FILM CAPACITORS HAVING MULTI-LAYERED CRYSTALLOGRAPHIC TEXTURES

(75) Inventors: Glen Fox, Colorado Springs, CO (US); Fan Chu, Colorado Springs, CO (US); Brian Eastep, Colorado Springs, CO (US); Shan Sun, Colorado Springs, CO (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/525,974

(22) Filed: Mar. 14, 2000

(51) Int. Cl.$^7$ .................. H01L 27/108; H01L 29/76; H01L 29/94; H01L 31/119
(52) U.S. Cl. ......................... 257/295; 257/306
(58) Field of Search ................. 257/295–310; 438/3, 240, 253–254

(56) References Cited

U.S. PATENT DOCUMENTS

| | | |
|---|---|---|
| 6,060,736 A | 5/2000 | Noshiro |
| 6,229,166 B1 * | 5/2001 | Kim et al. ............... 257/295 |
| 6,291,291 B1 | 9/2001 | Noshiro |

FOREIGN PATENT DOCUMENTS

JP   411220106 A   *   8/1999

OTHER PUBLICATIONS

X–Ray Diffraction Method For Determining Textured Volume Fractions in PZT Thin Films, G.R. Fox, Mat. Res. Symp. Proc. vol. 541, 1999.

* cited by examiner

Primary Examiner—Cuong Quang Nguyen
(74) Attorney, Agent, or Firm—Hogan & Hartson L.L.P.

(57) ABSTRACT

A ferroelectric thin film capacitor and a method for producing the same wherein the capacitor dielectric includes multi-layered crystallographic textures. An integrated circuit device, such as a non-volatile memory device, includes at least one capacitor having a top and bottom electrode thereof and a ferroelectric dielectric layer therebetween. The ferroelectric dielectric layer comprises a first ferroelectric layer having a first crystallographic texture forming a main body of the dielectric layer and a second ferroelectric layer having a second differing crystallographic texture forming an interface layer between the main body and one of the top and bottom electrodes.

9 Claims, 3 Drawing Sheets

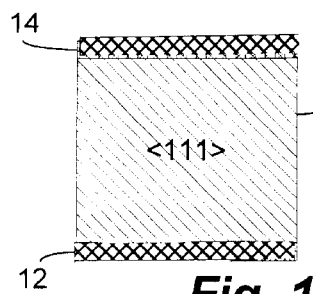 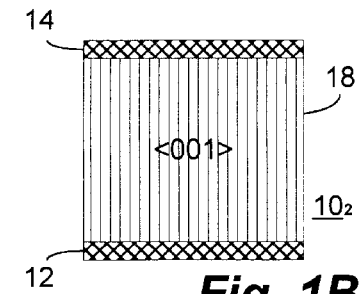 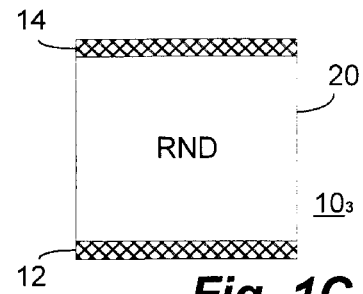
Fig. 1A *Prior Art*    Fig. 1B *Prior Art*    Fig. 1C *Prior Art*
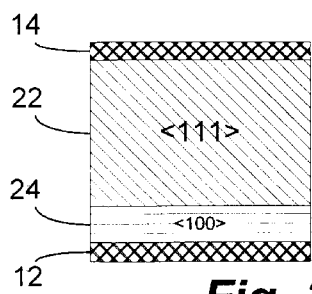 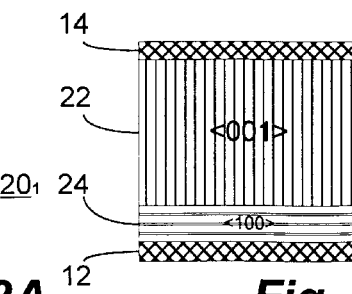 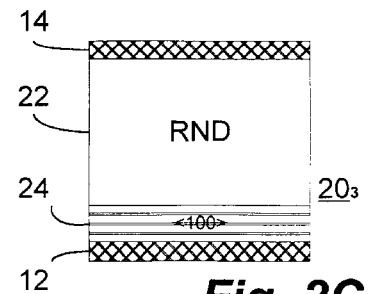
Fig. 2A    Fig. 2B    Fig. 2C
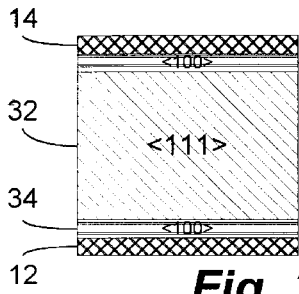 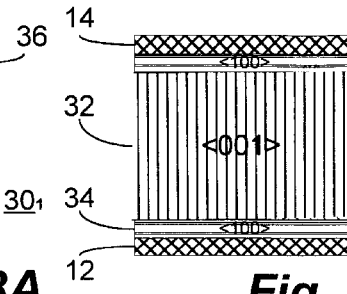 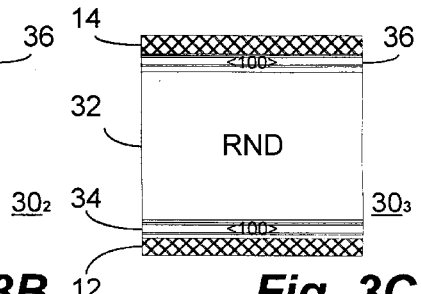
Fig. 3A    Fig. 3B    Fig. 3C
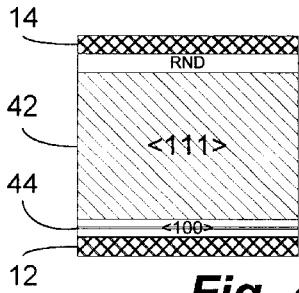 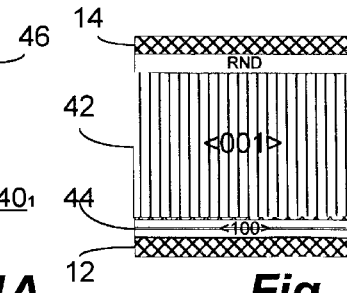 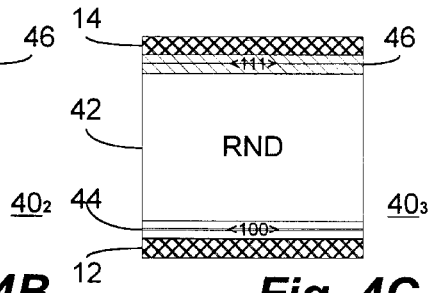
Fig. 4A    Fig. 4B    Fig. 4C

US 6,627,930 B1

FERROELECTRIC THIN FILM CAPACITORS HAVING MULTI-LAYERED CRYSTALLOGRAPHIC TEXTURES

BACKGROUND OF THE INVENTION

The present invention relates, in general, to the field of integrated circuit ("IC") devices incorporating ferroelectric capacitors. More particularly, the present invention relates to integrated circuit devices incorporating one or more ferroelectric thin film capacitors and a method for producing the same wherein the capacitor dielectric includes multi-layered crystallographic textures.

Ferroelectric memory devices, such as the FRAM® (FRAM® is a registered trademark of Ramtron International Corporation, Colorado Springs, Colo.) family of solid state, random access memory integrated circuits provide non-volatile data storage through the use of a ferroelectric dielectric material which may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field that exceeds the coercive field of the material. Conversely, reversal of the applied field reverses the internal dipoles.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and provide an indication of a stored logic "1" or "0" at the IC output pins. In a conventional two transistor/two capacitor ("2C/2T") ferroelectric memory cell for example, a pair of two data storage elements are utilized, each polarized in opposite directions. To "read" the state of a 2T/2C memory cell, both elements are polarized in the same direction and the sense amps measure the difference between the amount of charge transferred from the cells to a pair of complementary bit lines. In either case, since a "read" to a ferroelectric memory is a destructive operation, the correct data is then restored to the cell during a precharge operation.

In a simple "write" operation, an electric field is applied to the cell capacitor to polarize it to the desired state. Briefly, the conventional write mechanism for a 2T/2C memory cell includes inverting the dipoles on one cell capacitor and holding the electrode, or plate, to a positive potential greater than the coercive voltage for a nominal 100 nanosecond ('nsec.') time period. The electrode is then brought back to circuit ground for the other cell capacitor to be written for an additional nominal 100 nsec.

Certain ferroelectric dielectrics, such as lead zirconate titanate (PZT, a proprietary formulation of Ramtron International Corporation) may be produced with a variety of crystallographic textures, including <100>, <111>, <001> and random textures. For example, polycrystalline PZT films having the {100} crystal planes parallel to the substrate surface are said to be <100> textured. Films composed of crystallites that, on average, have no specific crystallographic orientation relative to the substrate surface are said to be randomly oriented.

Previously, it has been demonstrated that thin films can be produced with mixtures of textured PZT crystallites, however, it could not be unambiguously determined just how the textured crystallites were distributed through the film. Recently, grazing incident angle x-ray diffraction measurement techniques have been developed to determine that crystallites with differing types of crystallographic textures can be concentrated in well-defined layers throughout the thickness of a thin film dielectric.

See for example: Fox, G. R., "X-Ray Diffraction Method for Determining Textured Volume Fractions in PZT Thin Films". The position and thickness of PZT layers with differing textures strongly influences the ferroelectric performance of the PZT films including such properties as $Q_{sw}$ (switching polarization); V(90) (voltage at which $Q_{sw}$ is 90% of the maximum switched charge); fatigue (the decrease in $Q_{sw}$ with the number of switching cycles); retention (the decay of the stored state over time) and imprint (a condition wherein it becomes more difficult to switch to an opposite state from that currently stored).

SUMMARY OF THE INVENTION

In accordance with the principles of the present invention, many different types of thin film capacitor ferroelectric dielectric structures based on multi-layers of differing texture may be provided.

Generally, the main body (or bulk) of the film may consist of a ferroelectric dielectric (e.g. PZT) that is crystallographically oriented such that the spontaneous polarization of some component of the spontaneous polarization is aligned with the direction of the applied field (e.g. <111>, <001> or RND). In this way, the bulk of the film can be switched ferroelectrically. Relatively thin layers of ferroelectric dielectric with textures that are different from that of the bulk can be introduced at the interface between the bulk ferroelectric layer and the bottom and/or top electrodes. This interstitial (or interfacial) layer can be textured such that it can (or cannot) be switched ferroelectrically.

The advantages of these structures are that the interface properties can be tailored simply by altering the texture of the ferroelectric layer. The effect of the interface layer(s) is to change the electric field distribution across the bulk and interface due to differences in the dielectric constants of the different textured layers. In addition, charge trapping and domain pinning can be altered using the differing polarization states of the textured layers.

The technique of the present invention relates to the use of ferroelectric dielectrics such as PZT, strontium bismuth tantalate (SBT) or other Perovskite ferroelectric materials, whether lead based, strontium based or otherwise and regardless of whether the ferroelectric dielectric is utilized for its non-volatile storage characteristics or because of its enhanced dielectric characteristics in conventional capacitor applications such as in the memory cells of dynamic random access memory ("DRAM") memory cells.

In a exemplary embodiment disclosed herein utilizing PZT, an integrated circuit capacitor is formed comprising a dielectric having multiple layers of PZT with different crystallographic textures to produce a multi-layered thin film device with improved performance for non-volatile ferroelectric random access memory devices. The multi-layered crystallographic textured capacitors disclosed herein provide much enhanced performance and operating characteristics over conventional ferroelectric devices incorporating dielectric layers having but a single crystallographic texture.

Particularly disclosed herein is an integrated circuit device including at least one capacitor having a top and bottom electrode thereof and a ferroelectric dielectric layer therebetween. The ferroelectric dielectric layer comprises a first ferroelectric layer having a first crystallographic texture forming a main body of the dielectric layer and a second ferroelectric layer having a second differing crystallographic texture forming an interface layer between the main body and one of the top and bottom electrodes.

Also disclosed herein is a method for forming a capacitor comprising the steps of: providing a bottom electrode; forming a first ferroelectric dielectric layer overlying the bottom electrode, the first ferroelectric dielectric layer having a first crystallographic texture; also forming a second ferroelectric dielectric layer overlying the first ferroelectric dielectric layer, the second ferroelectric dielectric layer having a second crystallographic texture different than the first crystallographic texture; and providing a top electrode overlying the second ferroelectric dielectric layer.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 1A, 1B and 1C illustrate conventional capacitor structures incorporating ferroelectric dielectric materials having single crystallographic textures such as <111>, <001> and RND respectively and illustrating the bottom electrode ("BE") and top electrode ("TE") thereof;

FIGS. 2A, 2B and 2C illustrate possible capacitor structures in accordance with the principles of the present invention wherein a relatively thin layer of ferroelectric material having a <100> crystallographic texture is interposed between the main body (or bulk) of the capacitor dielectric and the bottom electrode in devices having a main body of <111>, <001> and RND crystallographic texture respectively;

FIGS. 3A, 3B and 3C illustrate further possible capacitor structures in accordance with the principles of the present invention wherein a relatively thin layer of ferroelectric material having a <100>crystallographic texture is interposed both between the main body of the capacitor dielectric and the top and bottom electrodes in devices having a main body of <111>, <001> and RND crystallographic texture respectively;

FIGS. 4A, 4B and 4C illustrate other possible capacitor structures in accordance with the principles of the present invention wherein a relatively thin layer of ferroelectric material having a <100> crystallographic texture is interposed between the main body of the capacitor dielectric and the bottom electrode and a relatively thin layer of ferroelectric material having either a RND or <111> crystallographic texture is interposed between the bulk and the top electrode in devices having a main body of <111>, <001> and RND crystallographic texture respectively;

DESCRIPTION OF A PREFERRED EMBODIMENT

Figure 5:
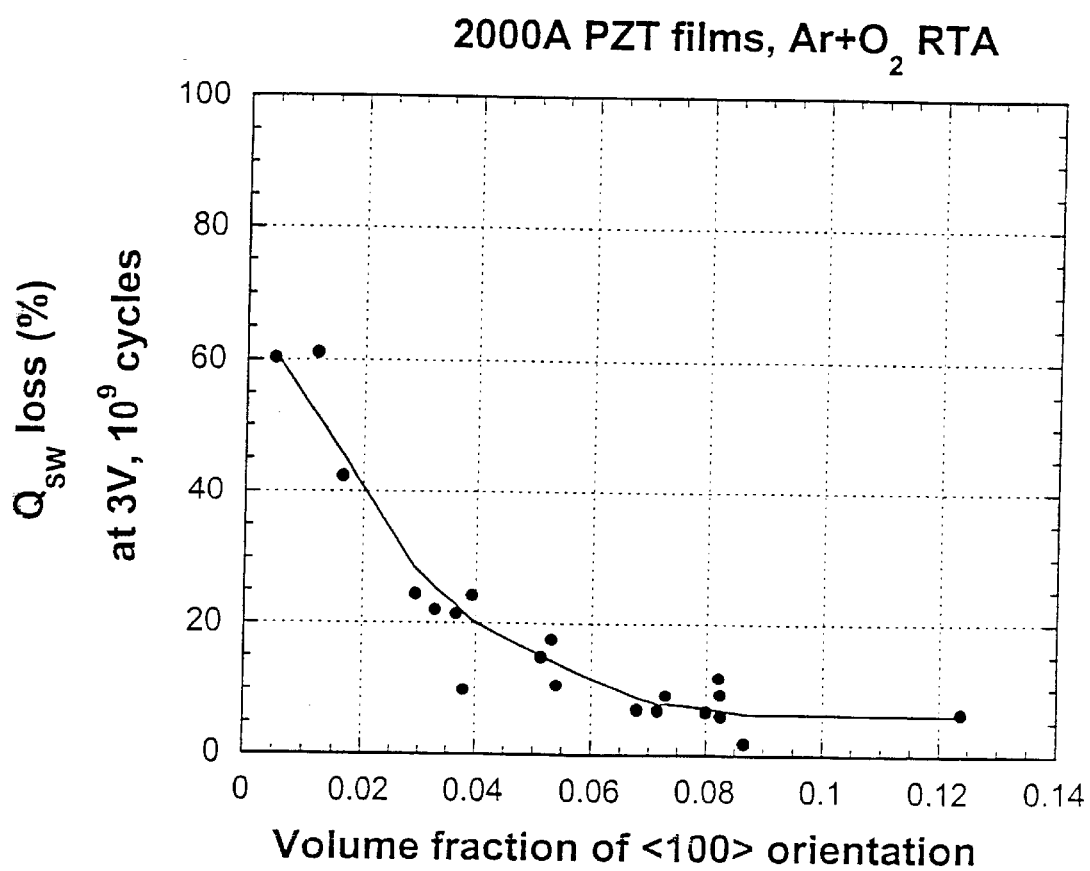
FIG. 5 is a graphical illustration of the 3.0 volt fatigue response of a capacitor in accordance with the present invention as a function of an interfacial layer having a <100> volume fraction.

With reference now to FIGS. 1A, 1B and 1C conventional capacitor structures 10 incorporating ferroelectric dielectric materials having only single crystallographic textures are shown. With reference to these figures, a capacitor 10 will include a bottom electrode 12 and a top electrode 14 with an interstitial dielectric layer such as a ferroelectric layer 16 having a crystallographic texture <111> (capacitor $10_1$, FIG. 1A), a ferroelectric layer 18 having a crystallographic texture <001> (capacitor $10_2$, FIG. 1B) or a ferroelectric layer 20 having a random ("RND") crystallographic texture (capacitor $10_3$, FIG. 1C). In each case, the direction of the polarization magnitude is generally from the bottom electrode 12 toward the top electrode 14. For this reason, ferroelectric dielectric material having a <100> crystallographic texture does not serve as a good bulk (or main body) material for a ferroelectric capacitor as the polarization of such textured material lies generally parallel to the plane of the bottom and top electrodes 12, 14.

Ferroelectric dielectric layers having a <001> crystallographic texture are generally preferred due to the orientation of the polarization, but due to the fact that growing it is generally more difficult than <111> material, the latter (or RND) is generally utilized.

With reference additionally now to FIGS. 2A, 2B and 2C, possible capacitor structures 20 in accordance with the principles of the present invention are shown. In each of these figures like structure to that previously described is like numbered and a relatively thin layer 24 of ferroelectric material having a <100> crystallographic texture has been grown interposed between the main body (or bulk) of the capacitor dielectric and the bottom electrode. Certain representative devices are illustrated having a main body of <111> (capacitor $20_1$, FIG. 2A), <001> (capacitor $20_2$, FIG. 2B) and RND (capacitor $20_3$, FIG. 2C) crystallographic texture respectively. The interstitial, or interfacial, layer 24 exhibits a dielectric constant similar to that of the main body dielectric in each instance. Therefore, an electric field can still be effectively applied across each of the capacitors 20. It has been found that the use of the layer 24 significantly reduces the undesired effects of dipole "pinning" which might otherwise occur when the bottom or top electrodes 12, 14 directly adjoin the ferroelectric bulk. As a consequence, a capacitor 20 produced in accordance with the principles of the present invention may be more easily switched between states. Experimentally, it has been found that the thickness of the layer 24 should be on the order of 25% or less of the thickness of the main body 22 of the ferroelectric dielectric.

With reference additionally now to FIGS. 3A, 3B and 3C, further possible capacitor structures 30 in accordance with the principles of the present invention are shown. In these figures, like structure to that previously described is like numbered and a relatively thin layer of ferroelectric material having a <100> crystallographic texture is interposed both between the main body of the capacitor dielectric 32 and the top (layer 36) and bottom electrodes (layer 34) in devices having a main body of <111> (capacitor $30_1$, FIG. 3A), <001> (capacitor $30_2$, FIG. 3B) and RND (capacitor $30_3$, FIG. 3C) crystallographic texture respectively. Experimentally, it is generally desirable that the combined thickness of the layers 34, 36 be substantially less than or equal to 25% of that of the main bulk ferroelectric dielectric layer 32. It has also been found that the thickness of the interface layers 34, 36 becomes more critical as the overall thickness of the capacitor 30 is decreased. Currently, this will equate to a thickness of about 200 Angstroms as a lower limit and 5.0 microns as an upper limit.

With reference additionally now to FIGS. 4A, 4B and 4C, other possible capacitor structures 40 in accordance with the principles of the present invention are shown. In these figures, like structure to that previously disclosed is similarly like numbered and a relatively thin layer of ferroelectric material having a <100> (layer 44) crystallographic texture is interposed between the main body of the capacitor dielectric 42 and the bottom electrode 12 and a relatively thin layer of ferroelectric material having either a RND (layer 46, FIGS. 4A and 4B) or <111> crystallographic texture (layer 46, FIG. 4C) is interposed between the bulk 42 and the top electrode 14. Various illustrative configurations are shown including devices having a main body of <111> (capacitor $40_1$, FIG. 4A), <001> (capacitor $40_2$, FIG. 4B) and RND (capacitor $40_3$, FIG. 4C) crystallographic texture respectively. It is apparent that many other possible capacitor configurations in accordance with the principles of the present invention may be illustrated without departing from the scope of the present invention.

Fundamentally, in the provision of a ferroelectric capacitor 20 (FIGS. 2A–2C), 30 (FIGS. 3A–3C) and 40 (FIGS. 4A–4C) for utilization of the non-volatile polarization states thereof, the capacitor structure is one in which the main body (or bulk) of the capacitor is switchable between discrete states while incorporating an interstitial (or interfacial) ferroelectric layer adjoining the bottom and/or top electrode that has a differing crystallographic texture. It should also be noted that the principles of the present invention are believed to be potentially useful in conjunction with capacitors having a ferroelectric dielectric main body and an interfacial layer having a differing crystallographic texture in applications wherein the ferroelectric dielectric is utilized for its properties of relatively larger dielectric constant properties than conventionally utilized in capacitors which do not utilize the switchable polarization states of the material. Examples would be relatively large value capacitors integrated with other circuitry (for example, filter capacitors) and memory cell capacitors (for example, in DRAMS) and other volatile memory devices and applications. In this regard, it is believed that the provision of the interfacial ferroelectric layer adjoining the bottom and/or top electrodes may improve the breakdown strength of the capacitor since this breakdown process is at least in part controlled by the crystal grain boundaries.

With reference now to FIG. 5, a graphical illustration of the 3 volt fatigue response of a capacitor in accordance with the present invention is shown as a function of <100> volume fraction. The volume fraction is the ratio of the thickness of the interfacial layer(s) to the total thickness of the dielectric between the bottom and top electrodes. As can be seen, the fatigue of the capacitor has been shown to be substantially minimized for <100> volume fractions of greater than or equal to 6.0%.

Figure 6:
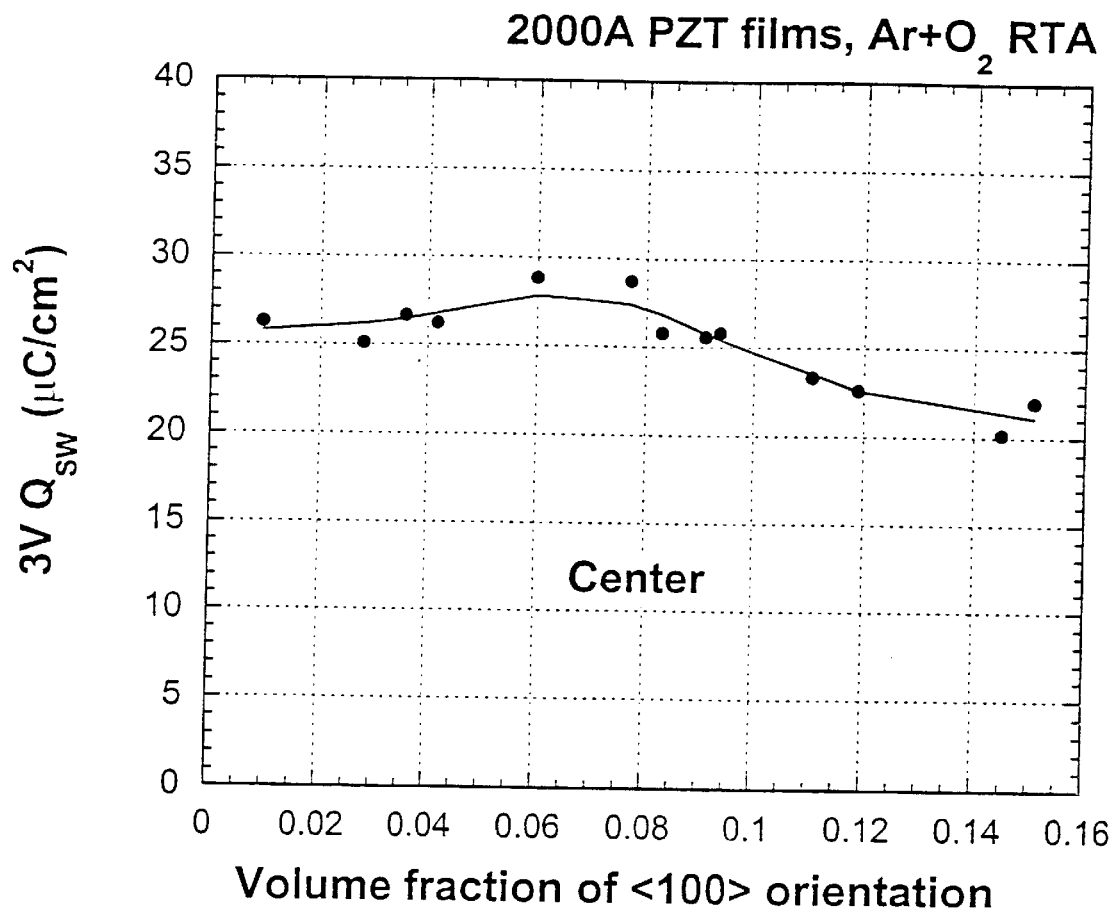
FIG. 6 is an additional graphical illustration of the $Q_{sw}$ characteristics of a capacitor in accordance with the principles of the present invention wherein $Q_{sw}$ remains relatively constant or is slightly improved in approximately the 6.0% to 8.0% <100> volume fraction range where fatigue is minimized.

With reference additionally now to FIG. 6, a further graphical illustration of the $Q_{sw}$ characteristics of a capacitor in accordance with the principles of the present invention is shown wherein $Q_{sw}$ remains relatively constant, or is slightly improved, in approximately the 6.0% to 8.0% <100> volume fraction range where fatigue is minimized.

That the <100> (or other) oriented interfacial layer material may be concentrated adjacent the bottom (or top) electrode can be confirmed by grazing incident angle X-ray diffraction. From the volume fraction measurement, the thickness of the interfacial layer for a 6.0% volume fraction is calculated to be approximately 120 Angstroms for a total film thickness of about 2000 Angstroms. From these measurements, it can be concluded that the optimum thickness of the interfacial layers should be approximately less than or equal to 25% of the total film thickness. It should also be noted that the interfacial layer(s) do not necessarily need to be continuous in order to obtain optimum ferroelectric capacitor performance and the forgoing examples illustrate that multi-layer structures comprising layers with different PZT orientations can be used to optimize ferroelectric thin film properties for non-volatile ferroelectric memory and other integrated circuit memory applications.

In accordance with the principles of the present invention, many different types of film structures based on multi-layers of differing texture may be provided. Generally, the main body (or bulk) of the film consists of a ferroelectric dielectric (e.g. PZT) that is crystallographically oriented such that the spontaneous polarization or some component of the spontaneous polarization is aligned with the direction of the applied field (e.g. <111>, <001> or RND). In this way, the bulk of the film can be switched ferroelectrically. Relatively thin layers of ferroelectric dielectric with textures that are different from that of the bulk can be introduced at the interface between the bulk ferroelectric layer and the bottom and/or top electrodes. This interstitial (or interfacial) layer can be textured such that it can (or cannot) be switched ferroelectrically.

The advantages of these structures are that the interface properties can be tailored simply by altering the texture of the ferroelectric layer. The effect of the interface layer(s) is to change the electric field distribution across the bulk and interface due to differences in the dielectric constants of the different textured layers. In addition, charge trapping and domain pinning can be altered using the differing polarization states of the textured layers.

The technique of the present invention relates to the use of ferroelectric dielectrics such as PZT, strontium bismuth tantalate (SBT) or other Perovskite ferroelectric materials, whether lead based, strontium based or otherwise and regardless of whether the ferroelectric dielectric is utilized for its non-volatile storage characteristics or because of its enhanced dielectric characteristics in conventional capacitor applications such as in the memory cells of dynamic random access memory ("DRAM") memory cells.

While there have been described above the principles of the present invention in conjunction with specific exemplary embodiments and applications, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including at least one capacitor having a top and bottom electrode thereof and a ferroelectric dielectric layer therebetween, wherein said ferroelectric dielectric layer comprises:

a first ferroelectric layer having a first crystallographic texture forming a main body of said dielectric layer; and a second differing ferroelectric layer having a <100> crystallographic texture forming an interface layer between said main body and said bottom electrode, said second ferroelectric layer being direct contact with an upper surface of said bottom electrode.

2. The integrated circuit device of claim 1 wherein said first and second ferroelectric layers comprise a Perovskite ferroelectric.

3. The integrated circuit device of claim 1 wherein said first and second ferroelectric layers comprise PZT.

4. The integrated circuit device of claim 1 wherein said first crystallographic texture of said first ferroelectric layer is <111>.

5. The integrated circuit device of claim 1 further comprising:

a third ferroelectric layer having said second crystallographic texture forming an additional interface layer between said main body and said top electrode.

6. The integrated circuit device of claim 1 wherein said second ferroelectric layer is substantially 25% or less of a total thickness of said ferroelectric dielectric layer.

7. The integrated circuit device of claim 6 wherein said second ferroelectric layer is substantially in the range of 6.0% to 8.0% of said total thickness of said ferroelectric dielectric layer.

8. The integrated circuit device of claim 5 wherein a combined thickness of said second and third ferroelectric layers is substantially 25% or less of a total thickness of said ferroelectric dielectric layer.

9. The integrated circuit device of claim 8 wherein said combined thickness of said second and third ferroelectric layers is substantially in the range of 6.0% to 8.0% of said total thickness of said ferroelectric dielectric layer.

* * * * *